United States Patent [19]
Stein et al.

[11] Patent Number: 5,882,736
[45] Date of Patent: Mar. 16, 1999

[54] PALLADIUM LAYERS DEPOSITION PROCESS

[75] Inventors: Ludwig Stein; Hartmut Mahlkow; Waltraud Strache, all of Berlin, Germany

[73] Assignee: Atotech Deutschland GmbH, Berlin, Germany

[21] Appl. No.: 914,956

[22] Filed: Aug. 20, 1997

Related U.S. Application Data

[63] Continuation-in-part of Ser. No. 537,914, Oct. 31, 1995, abandoned.

[30] Foreign Application Priority Data

May 13, 1993 [DE] Germany .......................... 43 16 679.2
Apr. 26, 1994 [DE] Germany .......................... 44 15 211.6

[51] Int. Cl.$^6$ ............... B05D 1/18; B05D 3/10; B05D 5/12
[52] U.S. Cl. ............. 427/437; 427/96; 427/126.5; 427/304; 427/443.1; 106/1.15; 106/1.24
[58] Field of Search ............... 427/304, 96, 437, 427/443.1, 126.5; 106/1.15, 1.24

[56] References Cited

U.S. PATENT DOCUMENTS

| | | | |
|---|---|---|---|
| 3,285,754 | 11/1966 | Hopkin | 106/1 |
| 3,418,143 | 12/1968 | Sergienko | 106/1 |
| 3,754,939 | 8/1973 | Pearlstein et al. | 106/1 |
| 4,156,040 | 5/1979 | Swider et al. | 427/226 |
| 4,255,194 | 3/1981 | Haugh et al. | 106/1.24 |
| 4,262,085 | 4/1981 | Ehrich et al. | 430/417 |
| 4,341,846 | 7/1982 | Hough et al. | 428/670 |
| 4,424,241 | 1/1984 | Abys | 427/443.1 |
| 4,753,821 | 6/1988 | Giesecke et al. | 427/98 |
| 4,804,410 | 2/1989 | Haga et al. | 106/1.15 |
| 4,966,786 | 10/1990 | Ehrich et al. | 427/97 |
| 5,037,795 | 8/1991 | Wieserman et al. | 502/401 |
| 5,167,992 | 12/1992 | Lin et al. | 427/437 |

FOREIGN PATENT DOCUMENTS

| | | | |
|---|---|---|---|
| 0423005 | 4/1991 | European Pat. Off. | C23C 18/44 |
| 0525282 | 2/1993 | European Pat. Off. | C23C 18/34 |
| 2841584 | 4/1980 | Germany | C23C 3/02 |
| 3000526 | 7/1980 | Germany . | |
| 4201129 | 7/1992 | Germany | H05K 1/11 |
| 1164776 | 9/1969 | United Kingdom | C23C 3/02 |

*Primary Examiner*—Shrive Beck
*Assistant Examiner*—Michael Barr
*Attorney, Agent, or Firm*—Cohen, Pontani, Lieberman & Pavane

[57] ABSTRACT

A formaldehyde-free chemical bath containing a palladium salt, a nitrogenated completing agent, and formic acid or formic acid derivatives, at a pH of greater than 4 and a process of using the chemical bath for depositing on a metal surface an adhesive, permanently glossy, bright palladium layer with few pores. The metal surface may be pretreated in a cementation palladium bath. The metal surface contains at least one of copper, nickel, and cobalt, as well as their alloys with one another and/or with phosphorus or boron.

16 Claims, No Drawings

5,882,736

PALLADIUM LAYERS DEPOSITION PROCESS

This is a continuation-in-part of application Ser. No. 08/537,914, filed Oct. 31, 1995, now abandoned.

BACKGROUND OF THE INVENTION

1. Field of the Invention

The invention relates to a process for depositing palladium layers on metal surfaces, a bath for carrying out the process, and the use of the process.

2. Background of the Invention

Base metals can be protected against the attack of aggressive gases or liquids by means of corrosion resistant metal coatings, the type of which is determined essentially by the intended use of the article. For example in a welding wire, iron/steel are protected against rusting by thin copper layers, deposited thereon. In the electronics industry, gold is commonly used for coating surfaces to be bonded or soldered or surfaces for electrical contact. Silver is generally not used for corrosion protection due to its tendency to migrate.

Nickel coatings may also be used for corrosion protection of, for example, copper and copper alloys. First the surfaces are superficially activated. Then the article having the surfaces to be coated is dipped into an acidic palladium solution, so that extremely fine palladium particles are formed, and on which the deposition of nickel starts. The palladium coating is not sealed but is very finely distributed. The palladium coated surfaces have a gray appearance. It is the subsequent nickel coating that seals the surface completely. However, the nickel coating layers are not resistant to oxidation. Thus, the nickel coated surfaces cannot be soldered or bonded after storage and are thus not suitable for providing corrosion protection to circuit boards.

For applications in which the corrosion-protection layer also serves as the final solderable and bondable layer, noble metals are primarily used. Palladium is generally used due to its relatively low cost when compared to other noble metals. Various baths for the chemical deposition of palladium layers are known in the art (e.g., U.S. Pat. No. 4,424,241, U.S. Pat. No. 3,418,143, U.S. Pat. No. 3,754,939, DE-OS 42 01 129, GB-PS 1,164,776, DE-OS 30 00 526, U.S. Pat. No. 4,341,846, U.S. Pat. No. 4,255,194, DE-OS 28 41 584, and EP-0 423 005 A1).

U.S. Pat. No. 4,424,241 discloses a process for the chemical deposition of palladium. The process operates at a pH-value lower than 2 and uses formic acid, among other agents, as a reducing agent. Along with carboxylic acid, amines are disclosed as complexing agents; however, no information is given about the particular type of amines used. Comparative tests show that the palladium layers deposited from these baths are black and do not adhere satisfactorily to the substrate. Furthermore, the baths decompose very rapidly. It is also stated that the danger of spontaneous decomposition of the bath exists when the concentration of the reducing agent is set too high.

U.S. Pat. No. 3,285,754 discloses a cementation bath for the deposition of palladium on copper and copper alloys and other substrates. The bath contains nitrito-palladium complexes and operates in the pH range of between 2 and 5. The palladium complex also contains complex-bound acid anions such as, for example, sulfate, acetate and chloride. However, the layers produced with the bath are extraordinarily thin and contain pores.

German publication DE-OS 42 01 129 discloses a process for producing a wiring board by means of currentless palladium-plating on the copper portions of the board. The process uses known palladium coating solutions as the palladium baths and which contain, for example, hypophosphorous acid, phosphorous acid or hydrated boron compounds but not formic acid as the reducing agent. During the coating process the coating solutions are enriched with reaction products, such as for example, phosphite, phosphate or borate, from the oxidation of the above-described reducing agents. These reaction products cause the deposition conditions to deteriorate due to, for example, increased stability of the bath against self-decomposition.

SUMMARY OF THE INVENTION

An object of the present invention is to avoid the disadvantages of the prior art and to provide a suitable process for the deposition of highly adhesive, permanently glossy palladium layers having very few pores on the metal surfaces. Another object of the present invention is to eliminate formation of oxidizing compounds on the palladium-plated surfaces at temperatures up to 280° C. and standing times of several hours, so that after storage in the air of at least 2 to 4 weeks the palladium-coated surfaces can still be flawlessly soldered.

DETAILED DESCRIPTION OF THE PREFERRED EMBODIMENTS

It is shown that palladium layers having the described advantages can be deposited from a formaldehyde-free chemical palladium bath. The coating is successful using only a brief coating process.

However, it is also possible, prior to the deposition of palladium in the formaldehyde-free chemical bath, to activate the metal surfaces, which may consist of copper, silver, nickel and cobalt as well as their alloys with one another and/or with phosphorous or boron, in a cementation palladium bath to which an oxidizing agent is added along with a palladium salt.

Any desired palladium salts such as, for example, palladium sulfate, palladium nitrate or palladium perchlorate may be added to this bath. The range of concentration of palladium salt is approximately 0.005 to 20 g/liter, preferably 0.1 to 2.0 g/liter.

Oxidizing agents, in a concentration of 0.01 to 100 g/liter, preferably 0.2 g/liter to 5.0 g/liter may be added. These oxidizing agents may, for example be, peroxo-disulfates, perchlorates, chlorates, perborates, periodates, peroxides (e.g., hydrogen peroxide), and/or nitrates of alkali metals, alkaline earth metals or ammonia.

To establish an acidic pH-value, an acidic salt (e.g., sodium hydrogensulfate), and/or an acid such as, for example, sulfuric acid or nitric acid, may be added to the cementation bath.

Preferred areas of use for the chemical palladium deposition bath and/or process of the present invention include circuit board manufacturing, production of electronic components, such as hybrid circuits and substrates for integrated circuits in which the palladium layers are generally applied to copper surfaces coated with the indicated metals or to copper surfaces themselves, and the production of microelectrode arrays. Furthermore, palladium layers of this type may also be used as corrosion protection and solder protection layers.

When the process according to the invention is used in circuit board manufacturing, the substrate surfaces of copper are cleaned prior to the deposit of palladium. For this purpose, etch cleaning is usually carried out in oxidizing, acidic solutions, such as, for example a solution of sulfuric acid and hydrogen peroxide, followed by another cleaning in an acidic solution, such as, for example, a sulfuric acid solution. After cleaning, the surfaces are activated with a solution containing palladium such as, for example, a hydrochloric-acidic palladium chloride solution, and then nickel-plated with standard chemical nickel baths. In general, nickel/phosphorus layers are deposited in this way. The solutions used for deposition contain sodium hypophosphite or hypophosphorous acid as the reducing agent. However, it is also possible to deposit nickel/boron layers or pure nickel layers. Instead of nickel, it is also possible to deposit cobalt or its alloys with phosphorus or boron or nickel/cobalt alloys or their alloys with phosphorus or boron.

After this, in one case, the surfaces can be dried and then, after pre-treatment in the cementation palladium bath, be treated with the formaldehyde-free chemical palladium bath; in another case, they can be immediately treated with the formaldehyde-free chemical palladium bath without pre-treatment in the cementation palladium bath. It is also possible to simply rinse the surfaces and then, without any further drying steps, coat them with palladium in the formaldehyde-free chemical palladium bath, with or without pre-treatment with the cementation palladium bath.

Technically useful layers having the characteristics mentioned above are deposited in an immersion time of only 5 minutes in the formaldehyde-free chemical bath. The thickness of the deposited layer in this case is approximately 0.2 $\mu$m.

The bath essentially contains a palladium salt, one or more nitrogenated complexing agents without sulfur contain compounds as stabilizer, and formic acids or formic acid derivates, but not hypophosphite and/or amine borane componds. The pH-value of the solution is above 4, preferably in the range from 5 to 6.

Any desired palladium compounds may be used as the palladium salts such as, for example, palladium chloride, palladium sulfate, palladium nitrate or palladium acetate.

As a reducing agent, not only formic acid itself is suitable, but its derivatives may also be used such as, for example, the esters of this acid, e.g., formic acid ethyl ester; the substituted and non-substituted amides, such as formamide and N,N-dimethyl formamide; the salts of formic acid, such as sodium formate; addition compounds; and activated formic acids, such as orthoformic acid. As the cations of the formic acid salts (formates), the elements of the first, second and third major groups, especially lithium, sodium, potassium, magnesium, calcium and aluminum, for example, may be used. Furthermore, formates that contain ammonium or quaternary ammonia compounds as the cation may also be used. However, hypophosphites and/or amine boraine compounds are not suitable as the reducing agent.

The use of formic acid or formic acid derivates as the reducing agent in the process is advantageous, because these compounds, in contrast to formaldehyde, are not harmful to one's health. Furthermore, only hydrogen and carbon dioxide and no toxic by-products are produced during their oxidation as the palladium is deposited. Advantageously, carbon dioxide does not build up in the solution when an acidic formaldehyde-free chemical bath is used, the hydrogen escapes spontaneously from the bath.

Preferably, primary, secondary or tertiary amines or polyamines are used as the nitrogenated complexing agents. They are, for example, ethylene-diamine; 1,3-diamino-propane, 1,2-bis (3-amino-propyl-amino)-ethane; 2-diethyl-amino-ethyl-amine; and diethylene-triamine.

In addition, diethylene-triamine-penta-acetic acid; nitro-acetic acid; N-(2-hydroxy-ethyl)-ethylene-diamine; ethylene-diamine-N,N-diacetic acid; 2-(dimethyl-amino)-ethyl-amine; 1,2-diamino-propyl-amine; 1,3-diamino-propyl-amine; 3-(methyl-amino)-propyl-amine; 3-(dimethyl-amino)-propyl-amine; 3-(diethyl-amino)-propyl-amine; bis (3-amino-propyl)-amine; 1,2-bis (3-amino-propyl)-alkyl-amine; diethylene-triamine; triethylene-tetramine; tetra-ethylene-pentamine; penta-ethylene-hexamine; and any desired mixtures of these nitrogenated complexing agents may also be used. However, sulfur containing compounds are not used as stabilizers together with the complexing agents.

The strength of the complexing agents in the bath depends on the palladium content. Typically, the mole ratios of the complexing agents to the palladium are from 5 to 50 to 1, whereby the strength of the complexing agents in the bath is 0.05 g/liter to 100 g/liters of bath.

The pH-value of the coating solution is generally greater than 4. At pH-values below 4, the solution becomes unstable and tends to self-decompose as hydrogen is produced. At pH-values slightly below 4, mainly poorly adhesive and dark palladium layers are deposited on the metal surfaces, while at pH-values lower than about 2 palladium precipitates out of the solution. In this case, the precipitates obtained on the substrate are black and inadequately adhesive.

The preferred pH-value of the coating solution is in the range from 5 to 6. At pH-values greater than 7, the tendency of the alkali bath to deposit palladium on the metal surfaces in a cementative fashion, i.e., not brightly glossy or adhering to the substrate increases. Furthermore, alkali coating solutions would attack the organic resistance films such as, for example, the solder stop masks, applied to the circuit board.

For baths having a high deposition rate that is achieved with a palladium concentration greater than 2 g/liter and a higher bath temperature such as, for example, above 50° C., or a bath load (i.e., article surface area per bath volume) greater than 2 dm$^2$/liter, it is advantageous to add stabilizers at a concentration of 0.1 to 100 milligrams/liter to the bath. Such stabilizers may, for example, be compounds of the elements selenium, tellurium, copper, nickel, iron and chromium such as, for example, mercapto-benzothiazole, potassium-seleno-cyanate, thiourea, and potassium-ferro-cyanate.

It has also been determined that the stability of the baths can be increased by feeding or conducting inert gases, such as for example, air or nitrogen, through the baths.

In accordance with the process of the present invention, it is possible to deposit highly pure, ductile palladium coatings at a rate of up to 5 $\mu$m/hour. During deposition of palladium, the coating layer thickness increases linearly with time. It is therefore possible to deposit thick palladium layers with the bath according to the present invention.

Deposition is preferably carried out in conventional immersion units, in which the substrate to be treated is immersed substantially in the vertical direction in the bath solutions. However, it is also contemplated that the substrate may be moved through a treatment unit in the horizontal direction and at least a portion of the substrate comes into contact with the bath solutions, for example, in a metallization unit for the selective metallization of contact areas on circuit boards.

The following examples illustrate various aspects of the present invention.

I) Formaldehyde-free chemical baths

EXAMPLE 1

A copper sheet was coated in the usual manner with a chemical nickel/phosphorus layer and then dried. The dry sheet was coated with palladium in a bath having the following composition:

| | |
|---|---|
| palladium acetate | 0.05 mole/liter |
| ethylene-diamine | 0.1 mole/liter |
| sodium formate | 0.2 mole/liter |
| succinic acid | 0.15 mole/liter |
| pH-setting with formic acid at 5.5 | |
| temperature: 67° C. | |

After one-half hour, the palladium layer had a thickness of 1.7 μm. The lack of pores in the coating was demonstrated by the salt spray test commonly used to determine the corrosion resistance of coatings.

EXAMPLE 2

A copper sheet was coated in the usual manner with a galvanic dull nickel layer and then dried. The dried sheet was coated with palladium in a bath having the following composition:

| | |
|---|---|
| palladium sulfate | 0.01 mole/liter |
| ethylene-diamine | 0.2 mole/liter |
| sodium formate | 0.3 mole/liter |
| potassium dihydrogen phosphate | 0.2 mole/liter |
| pH-setting with formic acid at 5.8 | |
| temperature: 63° C. | |

After an hour of exposure to the bath, the sheet attained a palladium layer thickness of 3.8 μm. No pores could be found by the salt spray test.

EXAMPLE 3

A copper sheet was coated in the usual manner with a galvanic glossy nickel layer and then dried. The dry sheet was then coated with palladium in a bath having the following composition:

| | |
|---|---|
| palladium acetate | 0.05 mole/liter |
| 1,2-bis (3-amino-propyl-amino)-ethane | 0.1 mole/liter |
| sodium formate | 0.3 mole/liter |
| succinic acid | 0.1 mole/liter |
| pH-setting with formic acid at 5.9 | |
| temperature: 59° C. | |

A 1 μm thick glossy layer was obtained on the sheet; no pores could be found on the palladium layer.

EXAMPLE 4

A copper-plated circuit board was coated in the usual manner with a chemical nickel/boron layer and then dried. After this, the circuit board was coated with palladium in a bath having the following composition:

| | |
|---|---|
| palladium dichloride | 0.5 mole/liter |
| 2-diethyl-amino-ethyl-amine | 0.6 mole/liter |
| formic-acid-ethyl-ester | 0.3 mole/liter |
| potassium dihydrogen phosphate | 0.2 mole/liter |
| pH-setting with formic acid at 6.0 | |
| temperature: 70° C. | |

Deposition of palladium was terminated after 10 minutes, and the circuit board was then rinsed and dried. A solder test performed on this board showed outstanding results.

EXAMPLE 5

Example 1 was repeated but instead of a chemical nickel/phosphorus layer, a chemical cobalt/phosphorus layer was first deposited on the copper sheet. This deposited layer was then coated with a palladium layer.

A brightly glossy palladium coating free of pores was obtained.

EXAMPLE 6

A substrate produced as in Example 1 was coated in a bath having the following composition:

| | |
|---|---|
| palladium dichloride | 0.01 mole/liter |
| 1,3 diamino-propane | 0.025 mole/liter |
| formamide | 0.05 mole/liter |
| sodium citrate | 0.1 mole/liter |
| pH-setting with diluted hydrochloric acid at 7.0 temperature: 80° C. | |

Again, a brightly glossy palladium coating free of pores was obtained.

EXAMPLE 7

A substrate produced as in Example 1 was coated in a bath having the following composition:

| | |
|---|---|
| palladium sulfate | 0.025 mole/liter |
| ammonium hydroxide | 0.125 mole/liter |
| N,N-dimethyl-formamide | 0.05 mole/liter |
| sodium boranate | 0.15 mole/liter |
| pH-setting with diluted ammonia at 10.5 temperature: 65° C. | |

A brightly glossy palladium coating free of pores was obtained.

EXAMPLE 8

A substrate produced as in Example 1 was coated in a bath having the following composition:

| | |
|---|---|
| palladium acetate | 0.05 mole/liter |
| ethylene-diamine | 0.1 mole/liter |
| sodium formate | 0.2 mole/liter |
| succinic acid | 0.15 mole/liter |
| pH-setting with formic acid at 7.0 | |
| temperature: 50° C. | |

A brightly glossy palladium coating free of pores was obtained.

EXAMPLE 9

A substrate produced as in Example 1 was coated in a bath having the following composition:

| | |
|---|---|
| palladium sulfate | 0.01 mole/liter |
| ethylene-diamine | 0.2 mole/liter |
| sodium formate | 0.3 mole/liter |
| potassium dihydrogen phosphate | 0.2 mole/liter |
| pH-setting with formic acid at 7.0 | |
| temperature: 70° C. | |

A brightly glossy palladium coating free of pores was obtained.

EXAMPLE 10

A substrate produced as in Example 1 was coated in a bath having the following composition:

| | |
|---|---|
| palladium acetate | 0.05 mole/liter |
| 1,2-bis (3-amino-propyl-amino)-ethane | 0.1 mole/liter |
| sodium formate | 0.3 mole/liter |
| succinic acid 0.1 mole/liter | |
| pH-setting with formic acid at 7.0 | |
| temperature: 90° C. | |

A brightly glossy palladium coating free of pores was obtained.

EXAMPLE 11

A substrate produced as in Example 1 was coated in a bath having the following composition:

| | |
|---|---|
| palladium sulfate | 0.1 mole/liter |
| ethylene-diamine | 0.2 mole/liter |
| sodium formate | 0.3 mole/liter |
| succinic acid 0.15 mole/liter | |
| hydroxy-ethane-sulfone acid | 0.0003 mole/liter |
| pH-setting with formic acid at 8.5 | |
| temperature: 75° C. | |

A brightly glossy palladium coating free of pores was obtained.

Comparative experiment

The test according to Example 1 was repeated. However, the pH-value of the palladium solution was set at 1.0.

The bath was not stable; rather, it decomposed as hydrogen developed and palladium precipitated. A black, dull coating was deposited on the metal sheet.

II) Pre-treatment with acidic cementation baths

EXAMPLE 12

A copper sheet was cathodically degreased in an electrolytic manner, and after being rinsed briefly (e.g., several seconds) the sheet was etched in an acidic peroxo-disulfate solution; after a further rinsing process, the sheet was coated with palladium in a bath. The bath had the following composition:

| | |
|---|---|
| sodium hydrogen sulfate | 30 g/liter |
| sodium nitrate | 3 g/liter |
| palladium (as palladium sulfate) | 0.2 g/liter |
| sulfuric acid | 0.6 g/liter |

Treatment conditions:

| | |
|---|---|
| temperature:. | 40° C. |
| treatment time: | 5 minutes |

The sheet was subsequently coated in the palladium bath according to Example 1. The copper sheet was coated with a whitely glossy palladium coating. The metal coating adhered very well (tesa test). Solderability of the coating, as measured by a wetting scale, was better than gold-plated surfaces. After 14 days of storage, no decline in solderability was found. The porosity of the coating was very low.

EXAMPLE 13

A copper sheet pre-treated as in Example 12 was treated in a solution having the following composition:

| | |
|---|---|
| sodium hydrogen sulfate | 20.0 g/liter |
| sodium peroxo-disulfate | 0.7 g/liter |
| palladium (as sulfate) | 0.2 g/liter |
| sulfuric acid | 0.6 g/liter |

Treatment conditions:

| | |
|---|---|
| temperature: | 40° C. |
| treatment time: | 5 minutes |

The copper sheet was coated with a light gray but glossy palladium coat. The sheet was subsequently coated in the palladium bath according to Example 1. A pore-free palladium coating was obtained. The adhesion of the palladium was very good (tesa test). Solderability was comparable to that prepared in Example 12.

EXAMPLE 14

A copper sheet pre-treated as in Example 12 was palladium-plated in a solution having the following composition:

| | |
|---|---|
| sodium hydrogen sulfate | 50.0 g/liter |
| potassium perchlorate | 5.0 g/liter |
| palladium (as sulfate) | 0.2 g/liter |

Treatment conditions:

| | |
|---|---|
| temperature: | 40° C. |
| treatment time: | 5 minutes |

After subsequent coating of the sheet with palladium as in Example 1, the sheet was coated with an even, glossy palladium layer, which had the same good characteristics as those described in Example 12.

EXAMPLE 15

Example 12 was repeated here; however, the copper sheet was first coated with a nickel/phosphorus layer prior to treatment in the acidic cementation palladium bath. The same good results were obtained.

EXAMPLE 16

Example 12 was repeated with an acidic cementation palladium bath having the following composition:

| | |
|---|---|
| palladium nitrate | 0.3 g/liter |
| nitric acid, conc. | 30 g/liter |

The same good results were obtained.

EXAMPLE 17

Example 12 was repeated with an acidic cementation palladium bath having the following composition:

| | |
|---|---|
| sodium hydrogen sulfate | 30 g/liter |
| sodium perborate | 0.05 g/liter |
| palladium (as palladium sulfate) | 0.2 g/liter |
| sulfuric acid | 0.6 g/liter |

The same good results were obtained.

EXAMPLE 18

Example 12 was repeated with an acidic cementation palladium bath having the following composition:

| | |
|---|---|
| sodium hydrogen sulfate | 30 g/liter |
| hydrogen peroxide (30% by weight) | 0.15 g/liter |
| palladium (as palladium sulfate) | 0.2 g/liter |
| sulfuric acid | 0.6 g/liter |

Again, good results were achieved.

EXAMPLE 19

In order to produce microelectrodes, polypropylene powder for chromatography (e.g., from Polyscience, Inc., Warrington, USA) was first pre-treated, activated and chemically nickel-plated according to the usual processes, and was then coated with palladium using the formaldehyde-free chemical bath as in Example 1.

The powder coated with palladium was then processed into pellets. This is accomplished by placing the powder into a pressing tool which then slowly and gradually pressed the powder up to the maximum pressing pressure of the tool.

The pressing tool with the pressed polypropylene powder was placed in an oven preheated to 210° C. and heated for 30 minutes. After this, in order to manufacture the microelectrode array, one face of the pellet obtained in this manner was polished and the other face was connected or contacted.

EXAMPLE 20

A silver sheet was activated with an acidic cementation palladium bath having the following composition:

| | |
|---|---|
| palladium nitrate | 0.3 g/liter |
| nitric acid | 6.0 g/liter |

The sheet was activated after 2 minutes and, following a rinsing, the sheet was coated for 15 minutes in a palladium bath according to Example 2 with 1.2 $\mu$m palladium.

The palladium coat had few pores and prevented migration of the silver.

EXAMPLE 21

A 1.7 $\mu$m thick palladium coating was prepared according to Example 1 on a copper panel coated with a nickel/phosphorus-alloy layer. The panel was immersed for 168 hours into a semi-concentrated nitric acid solution (one part-by-volume of water mixed with one part-by-volume of concentrated nitric acid, 65 vol.- %) at room temperature.

After removing the panel from the nitric acid solution no defect due to corrosion of the palladium layer could be observed.

EXAMPLE 22

A 0.5 $\mu$m thick palladium coating was deposited on an epoxy panel which had been catalyzed for electroless plating by the aid of a colloidal solution of palladium, stabilized with a polymeric protective colloid.

The panel coated with the palladium layer was immersed for 1 hour into a concentrated nitric acid solution (65 vol.-%) at room temperature.

After removing the panel from the nitric acid solution no defect due to corrosion o the palladium layer could be observed.

What is claimed:

1. A process for forming a layer of palladium, comprising the steps of:
   (a) providing an article having a metal surface;
   (b) providing a formaldehyde-free bath containing a palladium salt, at a pH of greater than 4;
   (c) preventing precipitation of the palladium from the bath by providing a nitrogenated complexing agent without using sulfur-containing compounds as stabilizers;
   (d) reducing the palladium from the bath by providing a reducing agent selected from the group consisting of formic acid and formic acid derivative, with the exclusion of hypophosphites and amine borane compounds; and
   (e) exposing the metal surface of the article to the bath so that a layer of palladium is formed on at least a portion of the metal surface of the article.

2. The process of claim 1, wherein the pH is between 5 and 6.

3. The process of claim 1, further comprising a step of activating the metal surface of the article by exposing the metal surface to an acidic bath containing a palladium salt and an oxidizing agent prior to the step (d).

4. The process of claim 3, wherein the step of activating, said oxidizing agent is selected from the group consisting of peroxo-disulfates, perchlorates, perborates, peroxides, nitrates and combinations thereof.

5. The process of claim 3, wherein the step of activating, said oxidizing agent has a concentration of between 0.01 and 100 g/liter of the bath.

6. The process of claim 3, wherein the palladium salt is selected from the group consisting of palladium sulfate, palladium nitrate and palladium perchlorate, and has a concentration of between 0.005 and 20 g/liter of the bath.

7. The process of claim 1, wherein the metal surface contains at least one of copper, silver, nickel, and cobalt.

8. The process of claim 1, wherein the metal surface comprises an alloy containing elements selected from the group consisting of copper, silver, nickel, and cobalt.

9. The process of claim 8, wherein the alloy further contains at least one of phosphorus and boron.

10. The process of claim 1, wherein the metal surface comprises an alloy containing an element selected from the group consisting of copper, silver, nickel, and cobalt and another element selected from the group consisting of phosphorus and boron.

11. The process of claim 1, wherein the article is a circuit board.

12. The process of claims 1, wherein the article is an electronic component.

13. The process of claim 1, wherein the article is a microelectrode.

14. The process of claim 1, wherein the metal surface comprises solder.

15. The method of claim 1, wherein the layer of palladium formed on the metal surface is glossy and free of pores.

16. A bath for depositing a palladium layer on a metal surface, consisting essentially of a palladium salt, a nitrogenated complexing agent, and at least one of formic acid and formic acid derivative, the bath being at a pH between 5 and 6.

* * * * *